(12) United States Patent
Yoo et al.

(10) Patent No.: US 8,772,867 B2
(45) Date of Patent: Jul. 8, 2014

(54) HIGH VOLTAGE HIGH SIDE DMOS AND THE METHOD FOR FORMING THEREOF

(71) Applicant: Monolithic Power Systems, Inc., San Jose, CA (US)

(72) Inventors: Ji-Hyoung Yoo, Cupertino, CA (US); Martin E. Garnett, Los Gatos, CA (US)

( * ) Notice: Subject to any disclaimer, the term of this patent is extended or adjusted under 35 U.S.C. 154(b) by 0 days.

(21) Appl. No.: 13/692,984

(22) Filed: Dec. 3, 2012

(65) Prior Publication Data
US 2014/0151792 A1   Jun. 5, 2014

(51) Int. Cl.
*H01L 29/66*   (2006.01)

(52) U.S. Cl.
USPC ........... 257/335; 257/328; 257/339; 257/341; 257/343

(58) Field of Classification Search
None
See application file for complete search history.

(56) References Cited

U.S. PATENT DOCUMENTS

| | | | |
|---|---|---|---|
| 7,265,416 B2 * | 9/2007 | Choi et al. | 257/343 |
| 2010/0096697 A1 * | 4/2010 | Su et al. | 257/343 |
| 2010/0301414 A1 | 12/2010 | Yoo | |
| 2012/0126340 A1 | 5/2012 | Disney | |
| 2012/0241862 A1 | 9/2012 | Zhang | |
| 2012/0244668 A1 | 9/2012 | Jung | |

* cited by examiner

*Primary Examiner* — Kyoung Lee
(74) *Attorney, Agent, or Firm* — Perkins Coie LLP

(57) ABSTRACT

A high voltage high side DMOS removing the N-buried layer from the DMOS bottom provides lower Ron*A at given breakdown voltage. The high voltage high side DMOS has a P-type substrate, an epitaxial layer, a field oxide, an N-type well region a gate oxide, a gate poly, a P-type base region, a deep P-type region, an N-type lightly doped well region, a first N-type highly doped region, a second N-type highly doped region and a P-type highly doped region.

15 Claims, 7 Drawing Sheets

HIGH VOLTAGE HIGH SIDE DMOS AND THE METHOD FOR FORMING THEREOF

TECHNICAL FIELD

The present invention relates to semiconductor devices, more specifically, the present invention relates to DMOS (Diffused Metal-Oxide Semiconductor) devices.

BACKGROUND

Switch mode power supplies are widely used in power conversion applications. A Buck converter is one of the well-known switch mode power supplies. The buck converter which comprises a high side power device 11, a low side power device 12, an inductor 13 and a capacitor 14 coupled as shown in FIG. 1 steps down an input voltage ($V_{IN}$) to a lower output voltage ($V_{OUT}$). Typically, the high side power device and the low side power device are DMOS devices due to the good performance of the DMOS devices.

In high voltage applications (e.g., the input voltage $V_{IN}$ may be higher than 100V), the size of a high side DMOS tends to be bigger than that of a low side DMOS. That is because the high side DMOS needs an N-buried layer (NBL) to isolate the body from the substrate. Then the breakdown voltage of the high side DMOS mainly relies on the doping of the drift region. While the low side DMOS may use RESURF action from the N-type well to the substrate junction to maintain the high breakdown voltage with no N-buried layer.

But with the development of the semiconductor industry, higher breakdown voltages and lower Ron*A (wherein A represents the area of the device) are both required.

SUMMARY

It is an object of the present invention to provide an improved high voltage switching device, which solves above problems.

In accomplishing the above and other objects, there has been provided, in accordance with an embodiment of the present invention, a high voltage high side DMOS, comprising: a P-type substrate with an epitaxial layer formed on the P-type substrate; a field oxide formed on the epitaxial layer; an N-type well region formed in the epitaxial layer; a gate oxide formed on the epitaxial layer; a gate poly formed on the gate oxide and on the field oxide; a P-type base region formed in the epitaxial layer; a deep P-type region merging with the P-type base region formed in the epitaxial layer; an N-type lightly doped well region formed under the P-type base region in the epitaxial layer, wherein the N-type well region is formed in the N-type lightly doped well region; a first N-type highly doped region formed in the N-type well region; a second N-type highly doped region formed in the P-type base region; a P-type highly doped region formed in the P-type base region, the P-type highly doped region being adjacent to the second N-type highly doped region; a TEOS layer formed on the gate poly; an inter layer dielectric formed on the TEOS layer and on the gate oxide; a drain electrode contacted with the first N-type highly doped region; and a source electrode contacted with both the second N-type highly doped region and the P-type highly doped region.

In addition, there has been provided, in accordance with an embodiment of the present invention, a method for forming a high voltage high side DMOS, comprising: forming an epitaxial layer on a substrate; forming a field oxide and an N-type well region in the epitaxial layer; forming a gate oxide on the epitaxial layer; forming a gate poly on the gate oxide and on the field oxide; forming a TEOS layer on the gate poly; forming a P-type base region in the epitaxial layer; forming a deep P-type region merging with the P-type base region in the epitaxial layer; forming a first N-type highly doped region in the N-type well region, forming a second N-type highly doped region and a P-type highly doped region adjacent to the second N-type highly doped region in the P-type base region; forming an inter layer dielectric on the TEOS layer and on the gate oxide; and forming a drain electrode contacted with the first N-type highly doped region, and forming a source electrode contacted with both the second N-type highly doped region and the P-type highly doped region.

Furthermore, there has been provided, in accordance with an embodiment of the present invention, a high voltage high side DMOS, comprising: a P-type substrate with an epitaxial layer formed on the P-type substrate; a field oxide formed on the epitaxial layer; an N-type well region formed in the epitaxial layer; a gate oxide formed on the epitaxial layer; a gate poly formed on the gate oxide and on the field oxide; a P-type base region formed in the epitaxial layer; a first N-type highly doped region formed in the N-type well region; a second N-type highly doped region formed in the P-type base region; and a P-type highly doped region formed in the P-type base region, the P-type highly doped region being adjacent to the second N-type highly doped region.

The use of the similar reference label in different drawings indicates the same of like components.

DETAILED DESCRIPTION

Embodiments of circuits/structures for high voltage high side DMOS are described in detail herein. In the following description, some specific details, such as example circuits for these circuit components, are included to provide a thorough understanding of embodiments of the invention. One skilled in relevant art will recognize, however, that the invention can be practiced without one or more specific details, or with other methods, components, materials, etc.

The following embodiments and aspects are illustrated in conjunction with circuits and methods that are meant to be exemplary and illustrative. In various embodiments, the above problem has been reduced or eliminated, while other embodiments are directed to other improvements.

For some white LED driver applications, the body to substrate potential difference is low (e.g., less than 1V). So the embodiments of the present invention remove the NBL from the high side DMOS to reduce the size of the device while having a lower Ron*A.

Figure 1:
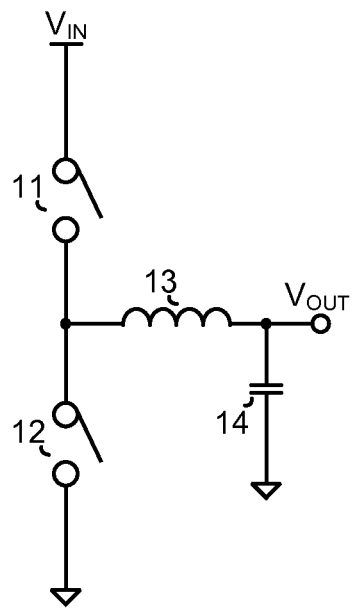
FIG. 1 schematically shows a conventional buck converter.
Figure 2:
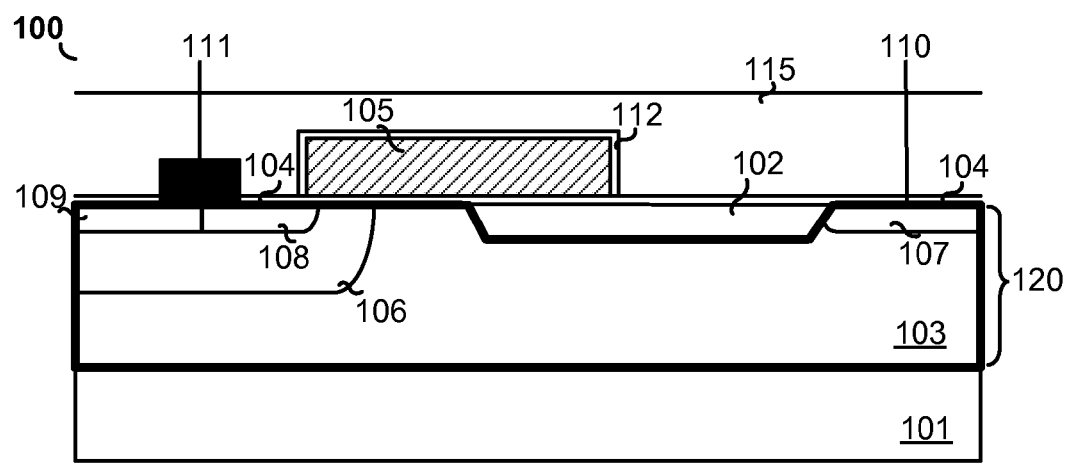
FIG. 2 schematically shows a cross-section view of a high voltage high side DMOS 100 in accordance with an embodiment of the present invention.

FIG. 2 schematically shows a cross-section view of a high voltage high side DMOS 100 in accordance with an embodiment of the present invention. In the example of FIG. 2, the high voltage high side DMOS 100 comprises: a P-type substrate 101; an epitaxial layer 120 formed on the P-type substrate 101; a field oxide 102 formed on the epitaxial layer 120; an N-type well region 103 formed in the epitaxial layer 120; a gate oxide 104 formed on the epitaxial layer 120; a gate poly 105 formed on the gate oxide 104 and on the field oxide 102; a TEOS (Tetra Ethyl Ortho Silicate) layer 112 formed on the gate poly 105; a P-type base region 106 formed in the epitaxial layer 120; a first N-type highly doped region (e.g., N$^+$) 107 formed in the N-type well region 103; a second N-type highly doped region (e.g., N$^+$) 108 formed in the P-type base region 106; and a P-type highly doped region (e.g., P$^+$) 109 formed in the P-type base region 106, wherein the P-type highly doped region 109 is adjacent to the second N-type highly doped region 108.

In one embodiment, the high voltage high side DMOS 100 further comprises an inter layer dielectric (ILD) 115 formed on the TEOS layer 112 and on the gate oxide 104; a drain electrode 110 contacted with the first N-type highly doped region 107; and a source electrode 111 contacted with both the second N-type highly doped region 108 and the P-type highly doped region 109.

In one embodiment, the TEOS layer 112 may have a thickness around 500 Å.

In one embodiment, the epitaxial layer 120 may be doped with P-type impurities. In other embodiments, the epitaxial layer 120 may be doped with N-type impurities.

In one embodiment, the N-type well region 103 acts as a drain body region, the P-type base region 106 acts as a source body region, the first N-type highly doped region 107 acts as a drain pickup, the second N-type highly doped region 108 acts as a source pickup, and the P-type highly doped region 109 acts as a body pickup.

In the embodiment of FIG. 2, the field oxide 102 has a shallow-trench isolation (STI) structure.

Figure 3:
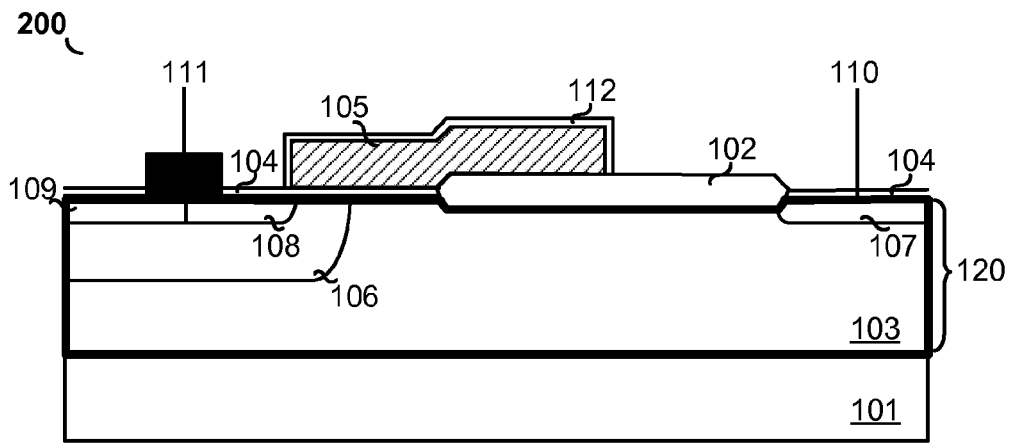
FIG. 3 schematically shows a cross-section view of a high voltage high side DMOS 200 in accordance with an embodiment of the present invention.

FIG. 3 schematically shows a cross-section view of a high voltage high side DMOS 200 in accordance with an embodiment of the present invention. The high voltage high side DMOS 200 in FIG. 3 is similar to the high voltage high side DMOS 100 in FIG. 2, with a difference that the field oxide 102 of the high voltage high side DMOS 200 in FIG. 3 has no STI structure. Specifically speaking, the high voltage high side DMOS 200 in the example of FIG. 3 comprises: a P-type substrate 101; an epitaxial layer 120 formed on the P-type substrate 101; a field oxide 102 formed on the epitaxial layer 120; an N-type well region 103 formed in the epitaxial layer 120; a gate oxide 104 formed on the epitaxial layer 120; a gate poly 105 formed on the gate oxide 104 and on the field oxide 102; a TEOS (Tetra Ethyl Ortho Silicate) layer 112 formed on the gate poly 105; a P-type base region 106 formed in the epitaxial layer 120; a first N-type highly doped region (e.g., N$^+$) 107 formed in the N-type well region 103; a second N-type highly doped region (e.g., N$^+$) 108 formed in the P-type base region 106; a P-type highly doped region (e.g., P$^+$) 109 formed in the P-type base region 106, wherein the P-type highly doped region 109 is adjacent to the second N-type highly doped region 108; a drain electrode 110 contacted with the first N-type highly doped region 107; and a source electrode 111 contacted with both the second N-type highly doped region 108 and the P-type highly doped region 109.

In the example of FIG. 3, an inter layer dielectric is not shown for ease of illustration, but one skilled in the art should realize that the high voltage high side DMOS 200 in FIG. 3 may comprise an inter layer dielectric.

In one embodiment, the TEOS layer 112 may have a thickness around 500 Å.

Figure 4:
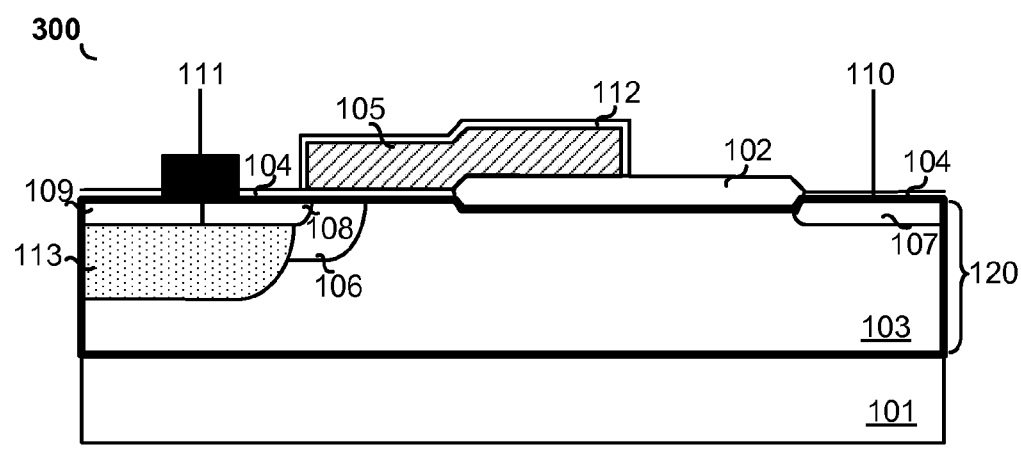
FIG. 4 schematically shows a cross-section view of a high voltage high side DMOS 300 in accordance with an embodiment of the present invention.

FIG. 4 schematically shows a cross-section view of a high voltage high side DMOS 300 in accordance with an embodiment of the present invention. The high voltage high side DMOS 300 in FIG. 4 is similar to the high voltage high side DMOS 200 in FIG. 3, with a difference that the high voltage high side DMOS 300 in FIG. 4 further comprises a deep P-type region 113 formed in the epitaxial layer 120, wherein the deep P-type region 113 acts as a supporting source body, and wherein the deep P-type region 113 merges with the P-type base region 106 to increase the curvature of the source body region and to decrease the parasitic NPN shunt resistance below the second N-type highly doped region 108, which improves the high voltage high side DMOS's robustness.

In one embodiment, the combined junction of the P-type base region 106 and the deep P-type region 113 may be round, and may have a curvature larger than 0.5 μm. In other embodiments, the combined junction of the P-type base region 106 and the deep P-type region 113 may have other curvatures.

In one embodiment, the deep P-type region 113 has an optimized dose and an optimized implant energy to form a large curvature around the source body. In one embodiment, the deep P-type region 113 may have a dose in the range of $1*10^{13}$ cm$^{-3}$ to $1*10^{15}$ cm$^{-3}$, and may have an implant energy around 100 keV. In other embodiments, the deep P-type region 113 may have other suitable doses and/or implant energies.

Figure 5:
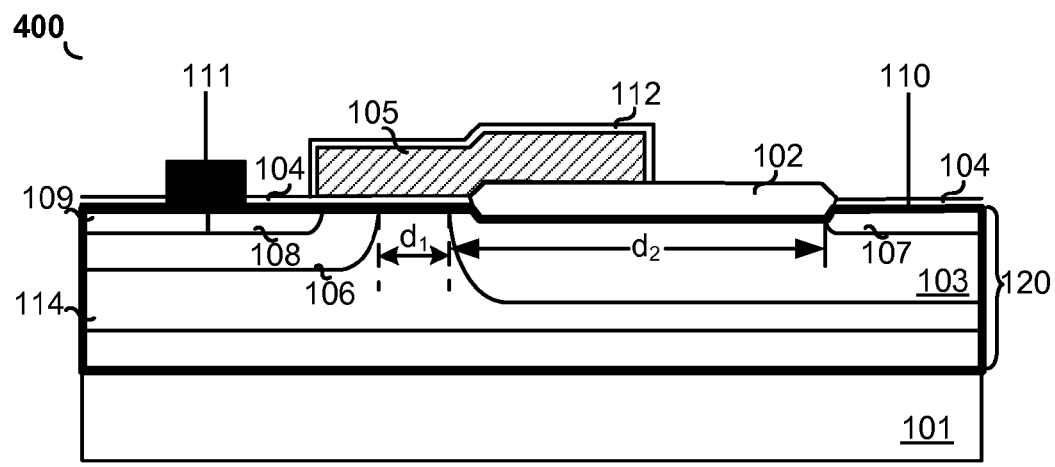
FIG. 5 schematically shows a cross-section view of a high voltage high side DMOS 400 in accordance with an embodiment of the present invention.

FIG. 5 schematically shows a cross-section view of a high voltage high side DMOS 400 in accordance with an embodiment of the present invention. The high voltage high side DMOS 400 in FIG. 5 is similar to the high voltage high side DMOS 200 in FIG. 3, with a difference that the high voltage high side DMOS 400 in FIG. 5 further comprises an N-type lightly doped well region 114 formed in the epitaxial layer 120. Specifically speaking, the high voltage high side DMOS 400 in the example of FIG. 5 comprises: a P-type substrate 101; an epitaxial layer 120 formed on the P-type substrate 101; a field oxide 102 formed on the epitaxial layer 120; an N-type well region 103 formed in the epitaxial layer 120; a gate oxide 104 formed on the epitaxial layer 120; a gate poly 105 formed on the gate oxide 104 and on the field oxide 102; a P-type base region 106 formed in the epitaxial layer 120; the N-type lightly doped well region 114 formed under the P-type base region 106 in the epitaxial layer 120, wherein the N-type well region 103 is formed in the N-type lightly doped well region 114; a first N-type highly doped region (e.g., N$^+$) 107 formed in the N-type well region 103; a second N-type highly doped region (e.g., N$^+$) 108 formed in the P-type base region 106; a P-type highly doped region (e.g., P$^+$) 109 formed in the P-type base region 106, wherein the P-type highly doped region 109 is adjacent to the second N-type highly doped region 108; a drain electrode 110 contacted with the first N-type highly doped region 107; and a source electrode 111 contacted with both the second N-type highly doped region 108 and the P-type highly doped region 109.

In one embodiment, the N-type lightly doped well region 114 may have an optimized width. In one embodiment, the space ($d_1$) from the edge of the P-type base region 106 to the edge of the N-type well region 103 may be around 0.8 μm, and the space ($d_2$) from the edge of the N-type well region 103 to the edge of the first N-type highly doped region 107 may be around 2.5 μm.

In one embodiment, the N-type lightly doped well region 114 and the N-type well region 103 acts as the drift region of the high voltage high side DMOS.

FIGS. 6A-6I partially schematically show cross-section views of a semiconductor substrate undergoing a process for forming a high voltage high side DMOS device in accordance with an embodiment of the present invention.

Figure 6A:
FIGS. 6A-6I partially schematically show cross-section views of a semiconductor substrate undergoing a process for forming a high voltage high side DMOS device in accordance with an embodiment of the present invention.

As shown in FIG. 6A, the process includes forming an epitaxial layer 120 on the substrate 101. In one embodiment, the epitaxial layer 120 may be formed by deposition technique such as chemical vapor deposition (CVD), plasma enhance chemical vapor deposition (PECVD), atomic layer deposition (ALD), liquid phase epitaxy, and/or other suitable deposition techniques. In one embodiment, the epitaxial layer 120 may be doped with P-type impurities. In other embodiments, the epitaxial layer 120 may be doped with N-type impurities.

Figure 6B:
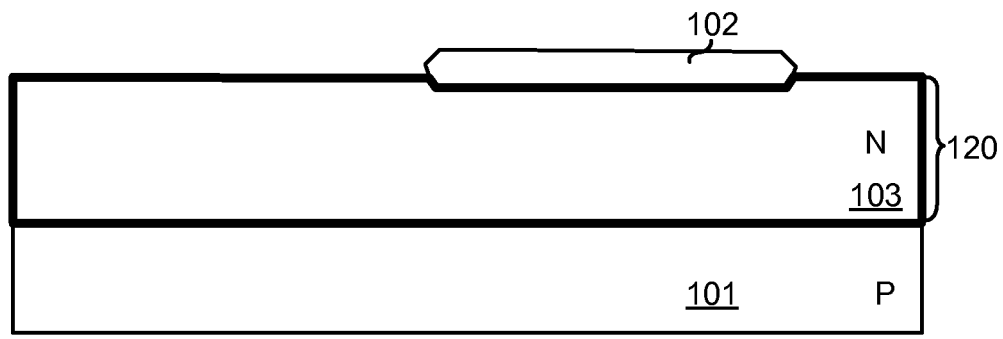

As shown in FIG. 6B, the process includes forming a field oxide 102 and an N-type well region 103 in the epitaxial layer 120. In the example of FIG. 6B, the field oxide 102 is formed not as a shallow-trench isolation (STI) structure. However, in other embodiments, the field oxide 102 may be formed as a STI structure. In one embodiment, the field oxide 102 may be formed by wet oxidation technique.

Figure 6C:
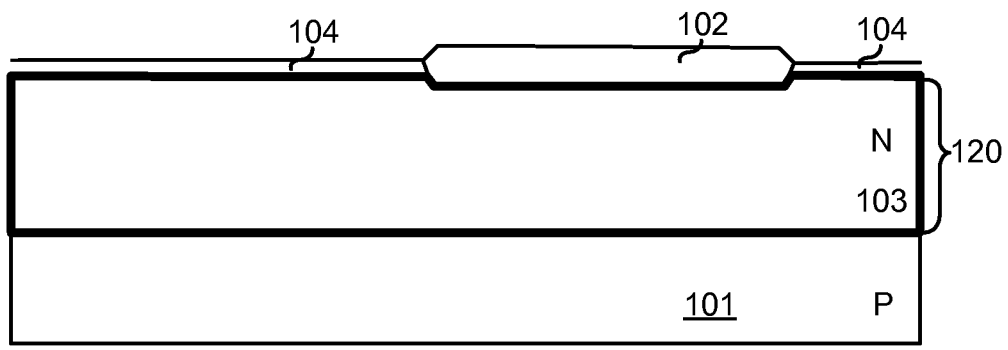

As shown in FIG. 6C, the process includes forming a gate oxide 104 on the epitaxial layer 120. In one embodiment, the gate oxide 104 may be formed by dry oxidation technology.

Figure 6D:
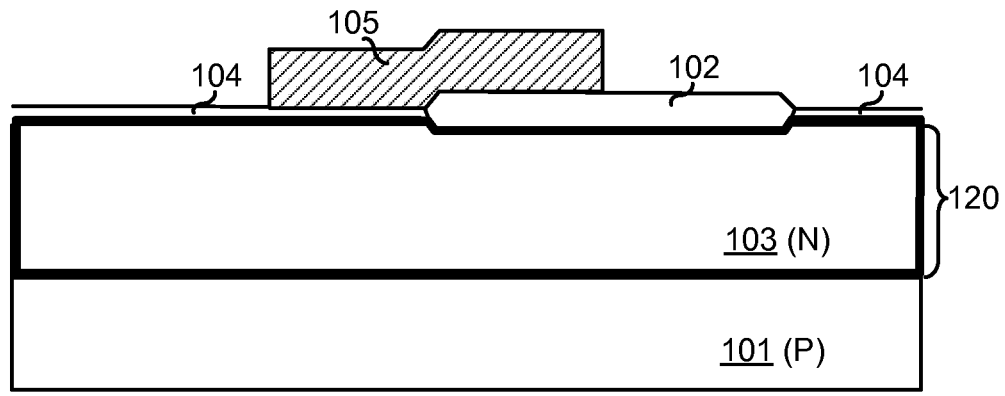

As shown in FIG. 6D, the process includes forming a gate poly 105 on the gate oxide 104 and on the field oxide 102.

Figure 6E:
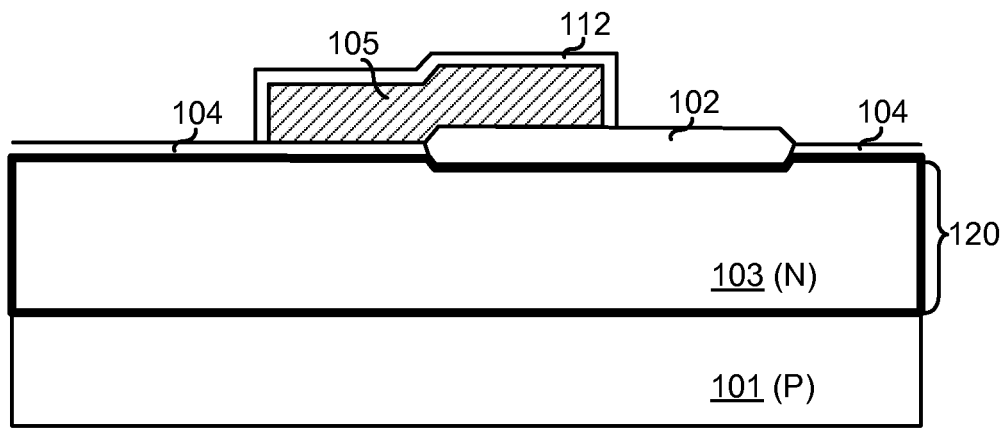

As shown in FIG. 6E, the process includes forming a TEOS layer 112 on the gate poly 105. In one embodiment, the TEOS layer 112 may have a thickness around 500 Å.

Figure 6F:
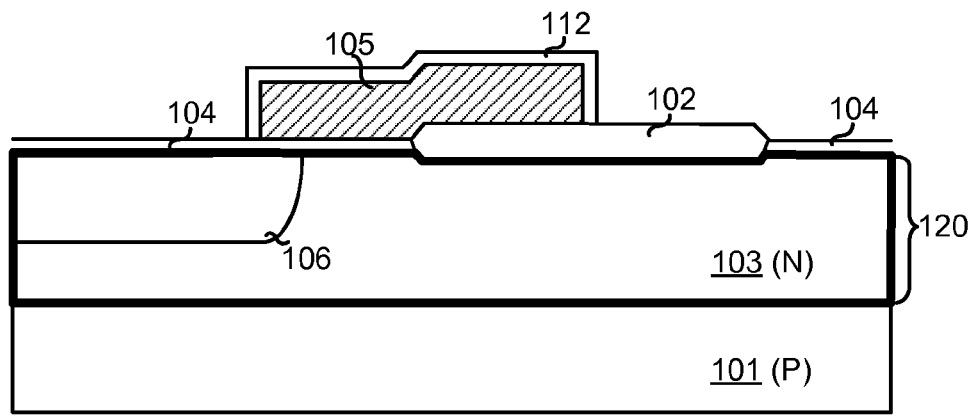

As shown in FIG. 6F, the process includes forming a P-type base region 106 in the epitaxial layer 120. In one embodiment, the P-type base region 106 may be formed by diffusion technology or implantation technology.

Figure 6G:
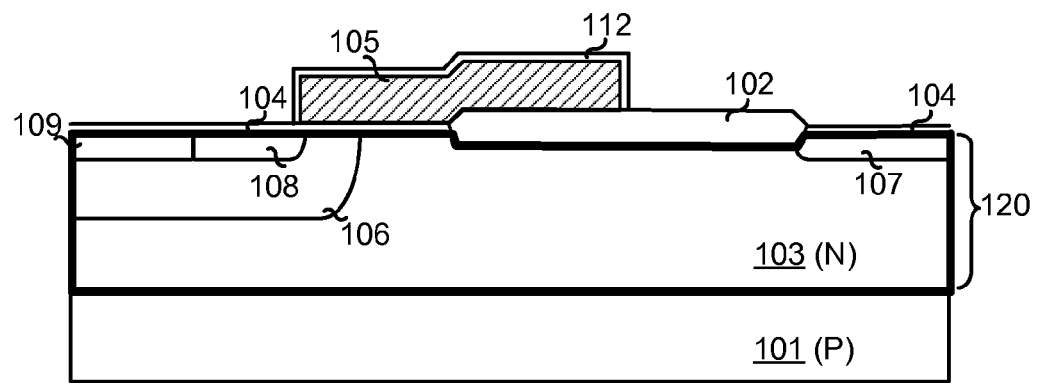

As shown in FIG. 6G, the process includes forming a first N-type highly doped region 107 in the N-type well region 103, forming a second N-type highly doped region 108 and a P-type highly doped region 109 adjacent to the second N-type highly doped region 108 in the P-type base region 106. In one embodiment, the first N-type highly doped region 107, the second N-type highly doped region 108 and the P-type highly doped region 109 may be formed by implantation technology.

Figure 6H:
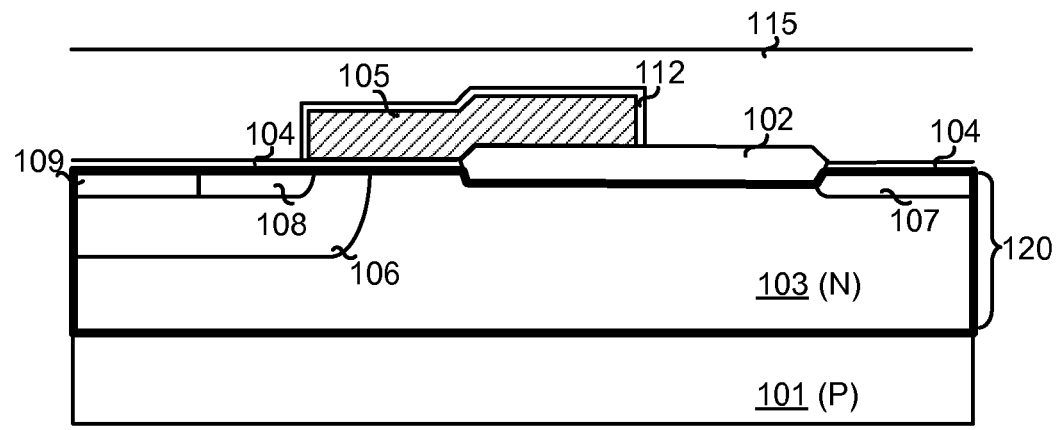

As shown in FIG. 6H, the process includes forming an inter layer dielectric 115 on the TEOS layer 112 and on the gate oxide 104. In one embodiment, the inter layer dielectric 115 may be formed by deposition technique.

Figure 6I:
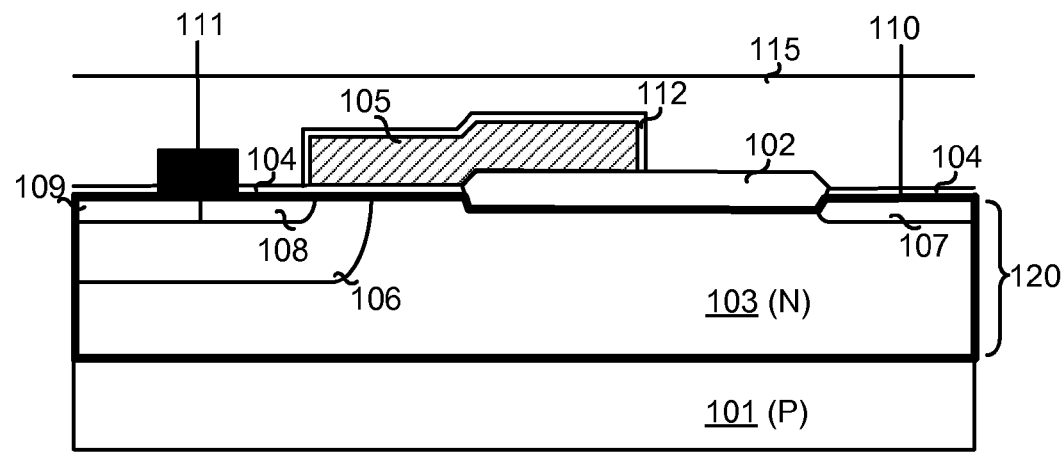

As shown in FIG. 6I, the process includes forming a drain electrode 110 contacted with the first N-type highly doped region 107, and forming a source electrode 111 contacted with both the second N-type highly doped region 108 and the P-type highly doped region 109.

In one embodiment, the process may further comprise forming an N-type lightly doped well region in the epitaxial layer 120 before the formation of the N-type well region 103, wherein the N-type well region 103 is formed in the N-type lightly doped well region, e.g., the N-type well region 103 is partial of the N-type lightly doped well region. In one embodiment, the N-type lightly doped region may be formed by diffusion technology or implantation technology.

In one embodiment, the process may further comprise forming a deep P-type region merging with the P-type base region 106 in the epitaxial layer 120 after the formation of the P-type base region 106. In one embodiment, the deep P-type region may be formed by diffusion technology or implantation technology. In one embodiment, the deep P-type region may be formed with a dose in the range of $1*10^{13}$ cm$^{-3}$ to $1*10^{15}$ cm$^{-3}$, and may be formed with an implant energy around 100 keV. In other embodiments, the deep P-type region may be formed with other suitable doses and/or implant energies.

Several embodiments of the foregoing high voltage high side DMOS have lower Ron*A compared to conventional high voltage high side DMOS. Unlike the conventional technique, several embodiments of the foregoing high voltage high side DMOS take the NBL away from the structure, thus having a smaller area at a given breakdown voltage, or having a higher breakdown voltage at a given area. In addition, several embodiments of the foregoing high voltage high side DMOS comprise a deep P-type region merged with the P-type base region. The deep P-type region is with optimized dose and optimized implant energy, thus the body curvature is increased and the parasitic NPN shunt resistance is decreased. The increased body curvature improves the breakdown voltage, while the lowered parasitic NPN shunt resistance provides a larger safe operating area (SOA) of the high voltage high side DMOS. Further, several embodiments of the foregoing high voltage high side DMOS comprise an N-type lightly doped well region formed in the epitaxial layer with optimized width, thus preventing punch-through between body and substrate.

This written description uses examples to disclose the invention, including the best mode, and also to enable a person skilled in the art to make and use the invention. The patentable scope of the invention may include other examples that occur to those skilled in the art.

We claim:

1. A high voltage high side DMOS, comprising:
a P-type substrate with an epitaxial layer formed on the P-type substrate;
a field oxide formed on the epitaxial layer;
an N-type well region formed in the epitaxial layer;
a gate oxide formed on the epitaxial layer;
a gate poly formed on the gate oxide and on the field oxide;
a P-type base region formed in the epitaxial layer;
a deep P-type region merging with the P-type base region formed in the epitaxial layer;
an N-type lightly doped well region formed under the P-type base region in the epitaxial layer, wherein the N-type well region is formed in the N-type lightly doped well region;
a first N-type highly doped region formed in the N-type well region;
a second N-type highly doped region formed in the P-type base region;
a P-type highly doped region formed in the P-type base region, the P-type highly doped region being adjacent to the second N-type highly doped region;
a TEOS layer formed on the gate poly;
an inter layer dielectric formed on the TEOS layer and on the gate oxide;
a drain electrode contacted with the first N-type highly doped region; and
a source electrode contacted with both the second N-type highly doped region and the P-type highly doped region.

2. The high voltage high side DMOS of claim 1, wherein the TEOS layer has a thickness around 500 Å.

3. The high voltage high side DMOS of claim 1, wherein the deep P-type region has a dose in the range of 1*1013 cm-3 to 1*1015 cm-3, and has an implant energy around 100 keV.

4. The high voltage high side DMOS of claim 1, wherein
the space from the edge of the P-type base region to the edge of the N-type well region is around 0.8 μm; and
the space from the edge of the N-type well region to the edge of the first N-type highly doped region is around 2.5 μm.

5. The high voltage high side DMOS of claim 1, wherein the combined junction of the P-type base region and the deep P-type region is round, and has a curvature larger than 0.5 μm.

6. A method for forming a high voltage high side DMOS, comprising:
forming an epitaxial layer on a substrate;
forming a field oxide and an N-type well region in the epitaxial layer;
forming a gate oxide on the epitaxial layer;
forming a gate poly on the gate oxide and on the field oxide;
forming a TEOS layer on the gate poly;
forming a P-type base region in the epitaxial layer;
forming a deep P-type region merging with the P-type base region in the epitaxial layer;
forming a first N-type highly doped region in the N-type well region, forming a second N-type highly doped region and a P-type highly doped region adjacent to the second N-type highly doped region in the P-type base region;
forming an inter layer dielectric on the TEOS layer and on the gate oxide;
forming a drain electrode contacted with the first N-type highly doped region, and forming a source electrode contacted with both the second N-type highly doped region and the P-type highly doped region.

7. The method of claim 6, further comprising: forming an N-type lightly doped well region in the epitaxial layer before the formation of the N-type well region, wherein the N-type well region is formed in the N-type lightly doped well region.

8. The method of claim 6, wherein the deep P-type region has a dose in the range of $1*10^{13}$ cm-3 to $1*10^{15}$ cm-3, and has an implant energy around 100 keV.

9. The method of claim 6, wherein the combined junction of the P-type base region and the deep P-type region is round, and has a curvature larger than 0.5 μm.

10. The method of claim 6, wherein
the space from the edge of the P-type base region to the edge of the N-type well region is around 0.8 μm; and
the space from the edge of the N-type well region to the edge of the first N-type highly doped region is around 2.5 μm.

11. A high voltage high side DMOS, comprising:
a P-type substrate with an epitaxial layer formed on the P-type substrate;
a field oxide formed on the epitaxial layer;
an N-type well region formed in the epitaxial layer;
a gate oxide formed on the epitaxial layer;
a gate poly formed on the gate oxide and on the field oxide;
a P-type base region formed in the epitaxial layer;
a first N-type highly doped region formed in the N-type well region;
a second N-type highly doped region formed in the P-type base region;
a P-type highly doped region formed in the P-type base region, the P-type highly doped region being adjacent to the second N-type highly doped region;
a TEOS layer formed on the gate poly;
an inter layer dielectric formed on the TEOS layer and on the gate oxide;
a drain electrode contacted with the first N-type highly doped region; and
a source electrode contacted with both the second N-type highly doped region and the P-type highly doped region.

12. The high voltage high side DMOS of claim 11, further comprising: a deep P-type region merging with the P-type base region formed in the epitaxial layer.

13. The high voltage high side DMOS of claim 11, further comprising: an N-type lightly doped well region formed under the P-type base region in the epitaxial layer.

14. The high voltage high side DMOS of claim 11, wherein the field oxide has a shallow-trench isolation structure.

15. The high voltage high side DMOS of claim 11, wherein the high voltage high side DMOS is in an application where the potential difference between the P-type base region to the substrate is less than one volt.

* * * * *